United States Patent
Sowlati et al.

(10) Patent No.: US 6,838,938 B2
(45) Date of Patent: Jan. 4, 2005

(54) COMMUNICATION SYSTEM AND ARRANGEMENTS COMPRISING SUCH A COMMUNICATION SYSTEM

(75) Inventors: Tirdad S. H. Sowlati, Costa Mesa, CA (US); Dominicus Martinus Wilhelmus Leenaerts, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/481,984

(22) PCT Filed: Jul. 3, 2003

(86) PCT No.: PCT/IB02/02730
§ 371 (c)(1),
(2), (4) Date: Dec. 23, 2003

(87) PCT Pub. No.: WO03/005574
PCT Pub. Date: Jan. 16, 2003

(65) Prior Publication Data
US 2004/0183596 A1 Sep. 23, 2004

(30) Foreign Application Priority Data
Jul. 6, 2001 (EP) .............................. 01202614

(51) Int. Cl.[7] ................................................ H03G 3/20
(52) U.S. Cl. ........................................ 330/136; 330/129
(58) Field of Search ............................... 330/136, 129, 330/285, 296, 140; 327/307

(56) References Cited

U.S. PATENT DOCUMENTS

| | | | |
|---|---|---|---|
| 6,130,579 A | 10/2000 | Iyer et al. | |
| 6,600,369 B2 * | 7/2003 | Mitzlaff | 330/149 |
| 6,650,181 B2 * | 11/2003 | Shinjo et al. | 330/136 |
| 6,714,071 B1 * | 3/2004 | Page | 330/136 |

* cited by examiner

Primary Examiner—Henry Choe
(74) Attorney, Agent, or Firm—Michael J. Ure

(57) ABSTRACT

A communication system comprising a power amplifier coupled to a detector and further coupled to a Bias generator. The detector comprises a controlled amplifier means for generating an output signal (Th_S), the said signal Th_S being indicative for the power of an input signal and having a controllable bias level. The Bias Generator comprises a Level Sensitive Current Generator (LSCG) for generating a current (Cc) controlled by the output signal Th_S. Said LSCG has a threshold level (TL) such that when the output Th_S signal is lower than the TL the current Cc is substantially zero. Otherwise the current Cc is linearly controlled by the signal Th_S. The Bias Generator further comprises an adapter coupled to the LSCG comprising a current controlled adapting means for generating a control signal (C_S) for controlling a property of the amplifier, the control signal C_S having a controllable linear dependency on the current Cc.

9 Claims, 6 Drawing Sheets

COMMUNICATION SYSTEM AND ARRANGEMENTS COMPRISING SUCH A COMMUNICATION SYSTEM

Figure 1:
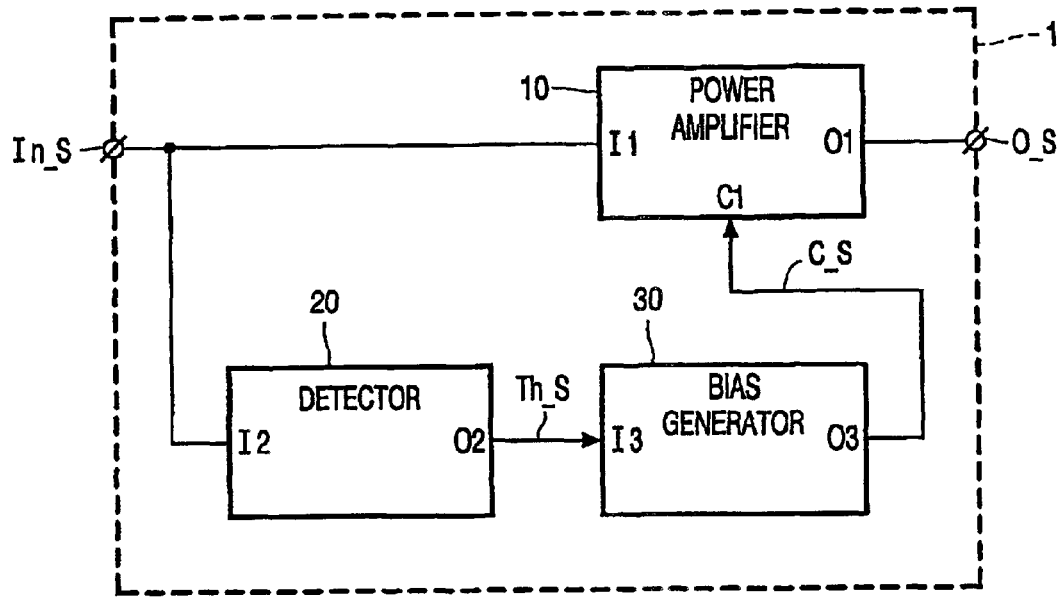

The invention relates to a communication system according to the preamble of claim 1. The invention further relates to arrangements comprising such a communication system.

Communication systems are between the most frequently used systems in a very much-connected world. The performance of the communication systems depends on the applications where they are used. In very high frequency applications there is a trade-off between the linearity and efficiency of such a communication system. Furthermore, in wireless applications there are standards as EDGE, AMPS, UMTS that use amplitude modulation arrangements. When one of the above mentioned standard is used, a very good linearity and efficiency are required. It is also preferable that communication systems have in the same time an as low as possible power consumption from external sources.

A method for reducing power consumption in a communication apparatus is known from EP-622895 A1. In this document it is presented a communication apparatus comprising a power amplifier. The bias voltage of the power amplifier is generated by an arrangement comprising a detector coupled to a Gate Bias Generator that is further coupled to an Adder, the detector being further coupled to a Main Controller. The detector generates a DC signal that is proportional to the input signal in the power amplifier the DC signal being further applied to the Gate Bias Generator (GBG). The GBG further generates a gate bias voltage suitable for biasing the power amplifier. The gate bias voltage is provided to a first input of the adder. A control signal generated by the Main Controller, which indicates whether the Main Controller transmits a signal or not, is provided at a second input of the Adder. When the Main Controller does not transmit a signal to the power amplifier, the power amplifier is not biased and when the Main Controller transmits a signal to the power amplifier then the power amplifier is biased taking into account the signal generated by the GBG. A drawback of this prior art is that it is necessary to include an adder that uses a dedicated signal generated by the Main Controller indicating whether the power amplifier has an input signal. That involves that the Main Controller has a special structure having an additional connection to the Adder. A further drawback is the supplementary delay of the signal when passing through the detector, GBG and Adder.

It is therefore an object of the present invention to provide a communication system and arrangements comprising such a communication system that uses only the input signal in the power amplifier.

In accordance with the invention, this object is achieved in a communication system according to the preamble of claim 1 being characterized in that the detector comprises a controlled amplifying means for generating an output signal said output signal being indicative for the power of the input signal, the output signal having a controllable bias level.

The Bias Generator comprises a Level Sensitive Current Generator (LSCG) for generating a current controlled by the output signal, the controllable threshold level of said signal being adaptable to the LSCG, said LSCG having a threshold level such that when the output signal is lower than the threshold level the current controlled by the output signal is substantially zero, otherwise the said current being linearly controlled by the output signal.

The Bias Generator further comprises an adapter coupled to the LSCG comprising a current controlled adapting means for generating a control signal for controlling a property of the amplifier, the control signal having a controllable linear dependency on the current controlled by the output signal.

The device according to the invention has the advantage that the generator providing the input signal need not be adapted to generate an additional signal to indicate whether the generator transmits a signal or not. The detector comprises amplifier means and provides at it's output a signal that is indicative for the power of the input signal. A separate generator controls a bias at the output of the amplifier means and the output signal has a controllable bias level. The bias generator comprises a Level Sensitive Current Generator (LSCG) and it is characterized in that when it receives a signal below a predetermined threshold level it's output current is substantially zero. Otherwise the output current is substantially linearly dependent on the input signal. The Bias Generator further comprises an adapter for adapting the current generated by the Bias Generator to a power amplifier. The adapter comprises adapting means for generating the control signal that controls the power amplifier such that the dependency between the output signal and the input current is controllable.

In a preferred embodiment the detector comprises a controlled amplifier means, said controlled amplifier means further comprising an amplifier coupled to a low-pass filter for amplifying the input signal in a controllable manner and transmitting the output signal. The low-pass filter realizes a supplementary filtering of high frequency components of the output signal of the amplifying means if the filtering realized by the output impedance of the amplifier means and the input capacitance of the LGSC is not enough for filtering high frequency components of the signal or of spurious signal that could be present at the input of LGSC. In fact, the low-pass filtering assures a substantially Direct Current (DC) signal at the input of LGSC. The low-pass filter can be realized in various modes as with inductors and capacitors, as switched capacitor filters, as transmission lines coupled to capacitors. In a preferred embodiment the low-pass filter is realized with a plurality of resistors and capacitors. This solution is very suitable to be used in relatively very high frequency communication systems.

In another embodiment of the invention the control signal is a vector of signals. This feature is useful when the power amplifier has a plurality of stages coupled in cascade i.e. the output signal of a previous stage being the input signal in the next stage, each of said stages being controlled by a component of the vector of signals.

In an embodiment of the invention an emitting system comprises a plurality of communication systems as claimed in claim 1 coupled in cascade. In this case the output signal of one communication system is inputted to both the next communication system and the next detector.

It is another object of the invention to provide an arrangement comprising the communication system coupled to a Variable Gain Amplifier, said arrangement having an improved linearity. The arrangement further comprises an input for receiving an input signal having a first phase and an output for transmitting an output signal having a second phase. The arrangement further comprises a polar indicator having a first receiving input coupled to the input and a second receiving input coupled to the output for generating a second control signal to be transmitted through a first transmitting output. The second control signal is indicative for a phase difference between the first phase and the second phase, the variable gain amplifier having an input for receiving the input signal, an output and a first control input. The output is coupled to the input of the communication system, said VGA being conceived to transmit a signal through the output representing an amplification of the input signal under the control of the second control signal. The above described arrangement comprises a polar indicator that generates a control signal that is indicative for a phase difference between the input signal in the arrangement and the output signal of the power amplifier. This kind of additional control of the power amplifier is provided when an additional linearity improvement of the amplifier is needed.

It is another object of the invention to provide an arrangement comprising the communication system coupled to a Variable Gain Amplifier (VGA), said arrangement having a improved efficiency. The arrangement further comprises an input for receiving an input signal having a first power and an output for transmitting an output signal having a second power. The arrangement further comprises a power indicator comprising a third receiving input for receiving the input signal, a fourth receiving input for receiving the output signal. The power indicator generates a third control signal through a second transmitting output, the third signal being indicative for a power difference between the first power and a part of the second power. The variable gain amplifier has an input for receiving the input signal, an output and a third control input. The output is coupled to the input of the communication system, said variable gain amplifier being conceived to transmit a signal through the output representing an amplification of the input signal under the control of the third control signal. When a further improved efficiency of the power amplifier is necessary then the above mentioned power indicator is used. The power indicator provides at it's output a control signal that is indicative for the power difference between the power of the input signal and a part of the power of the power amplifier output signal improving the efficiency of the arrangement.

Figure 2:
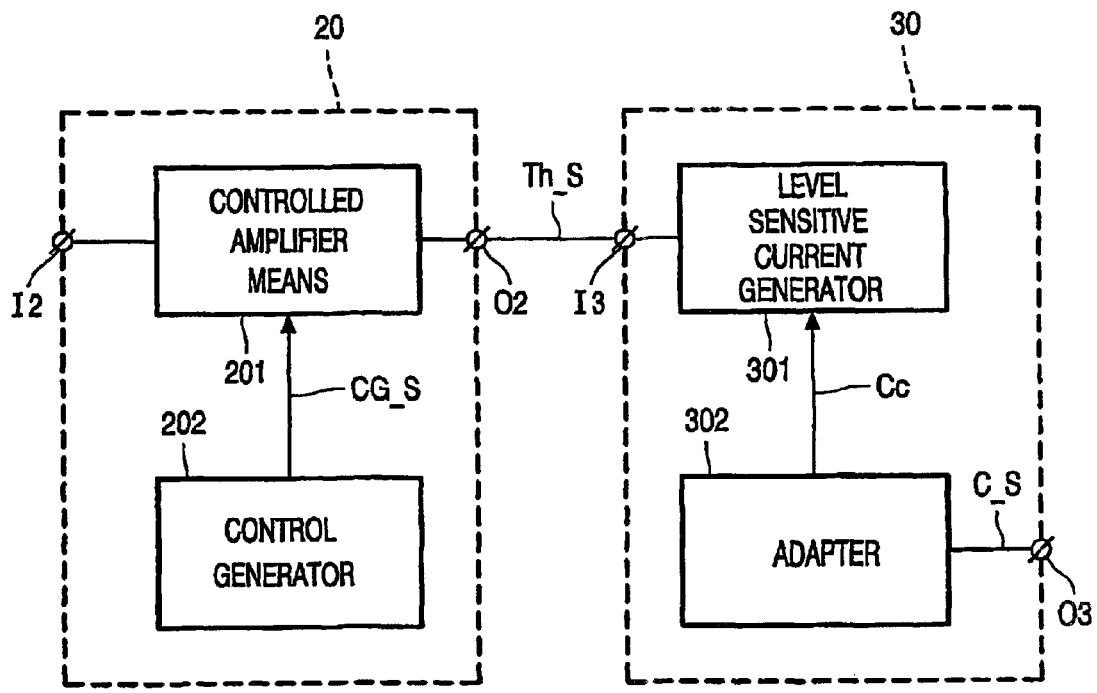
Figure 3:
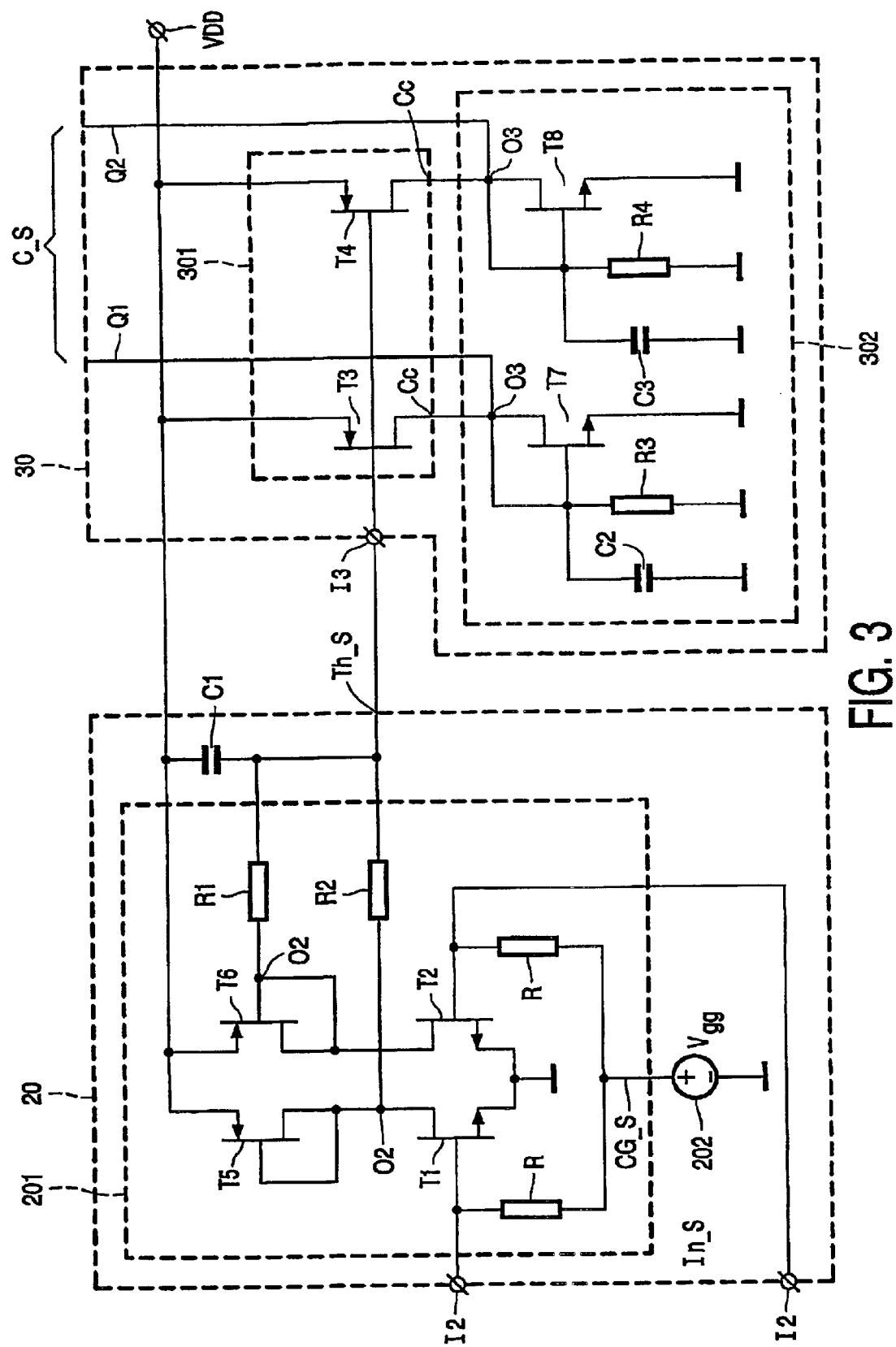
Figure 4:
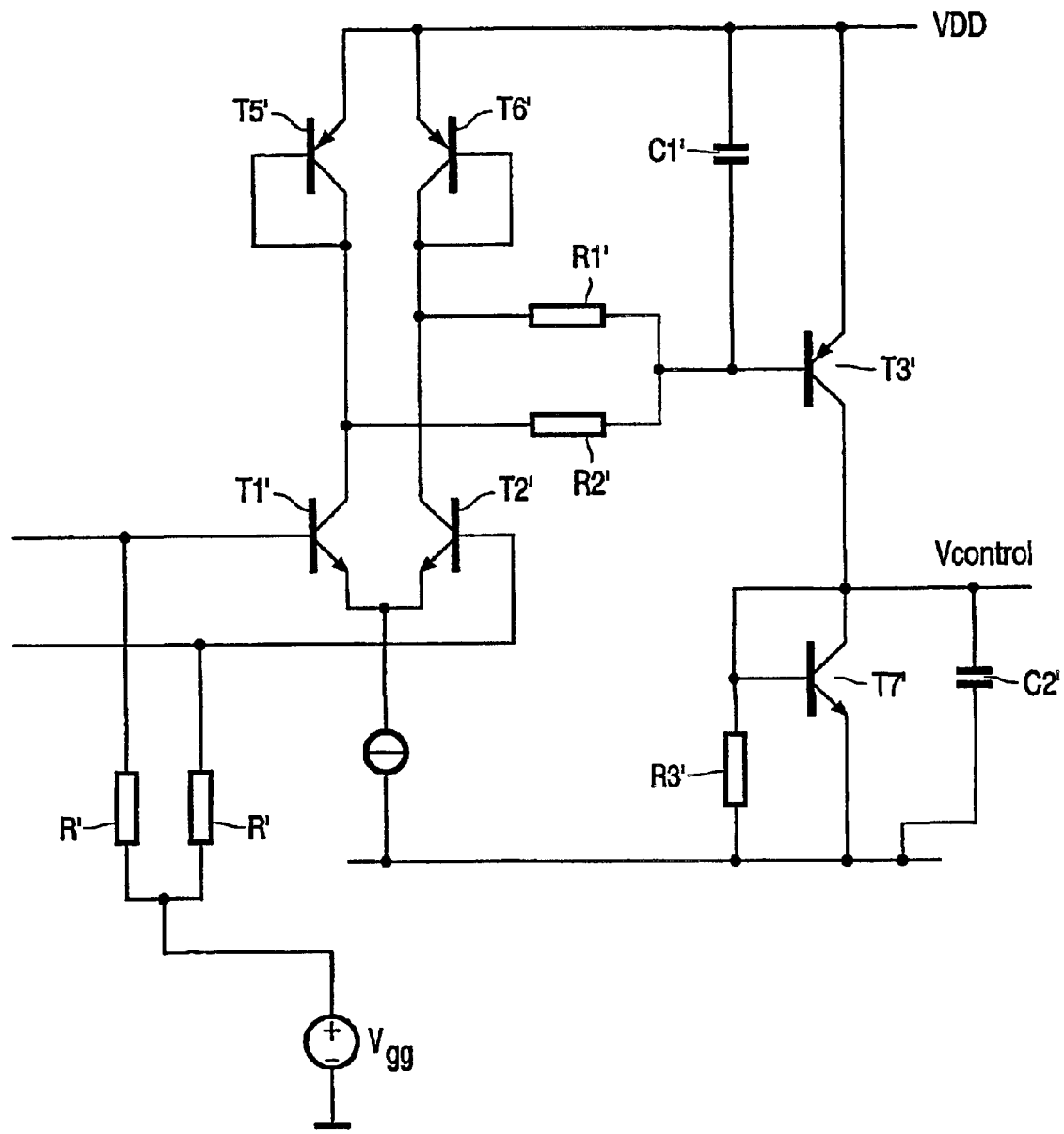
Figure 5:
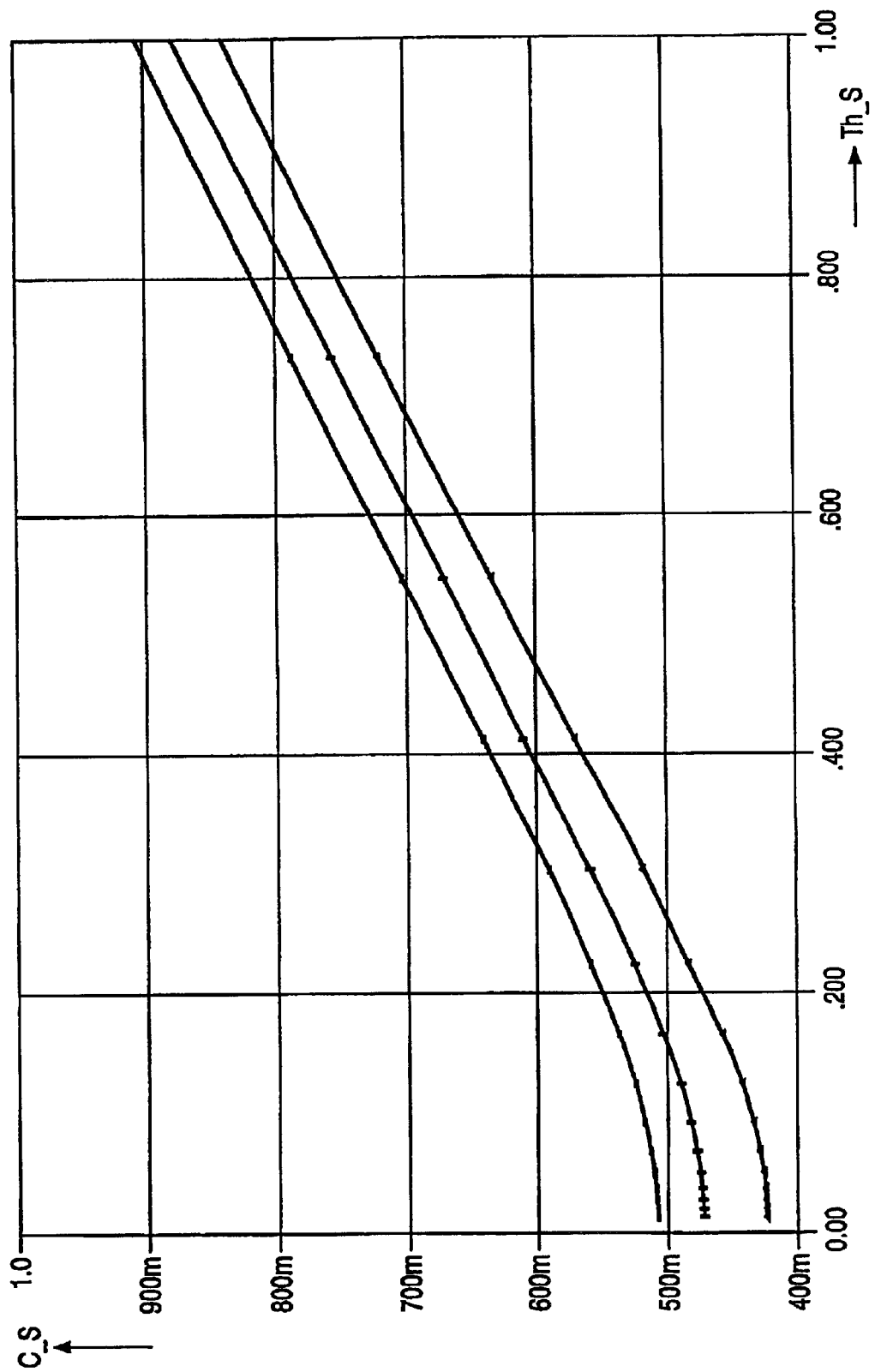
Figure 6:
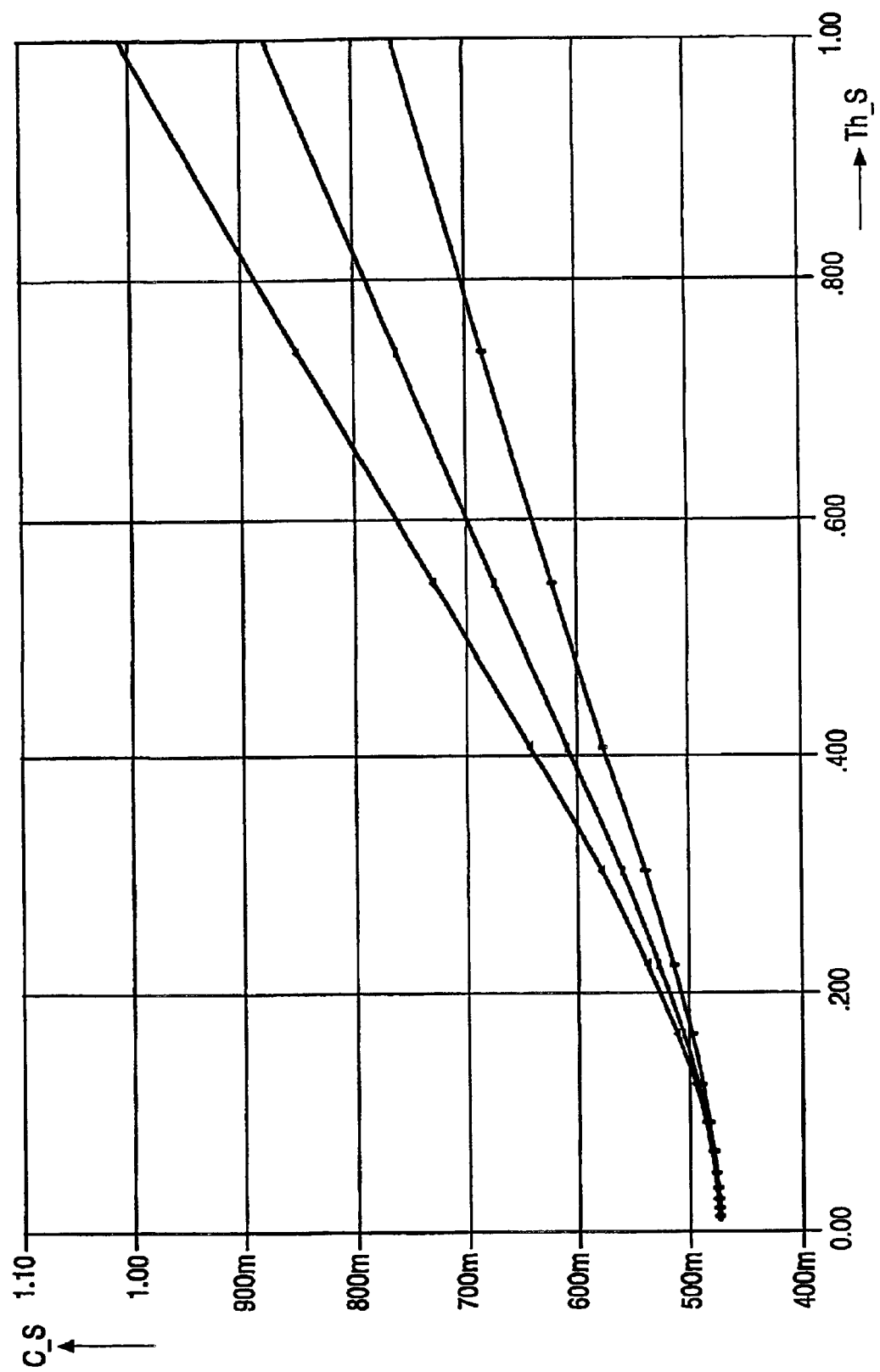
Figure 7:
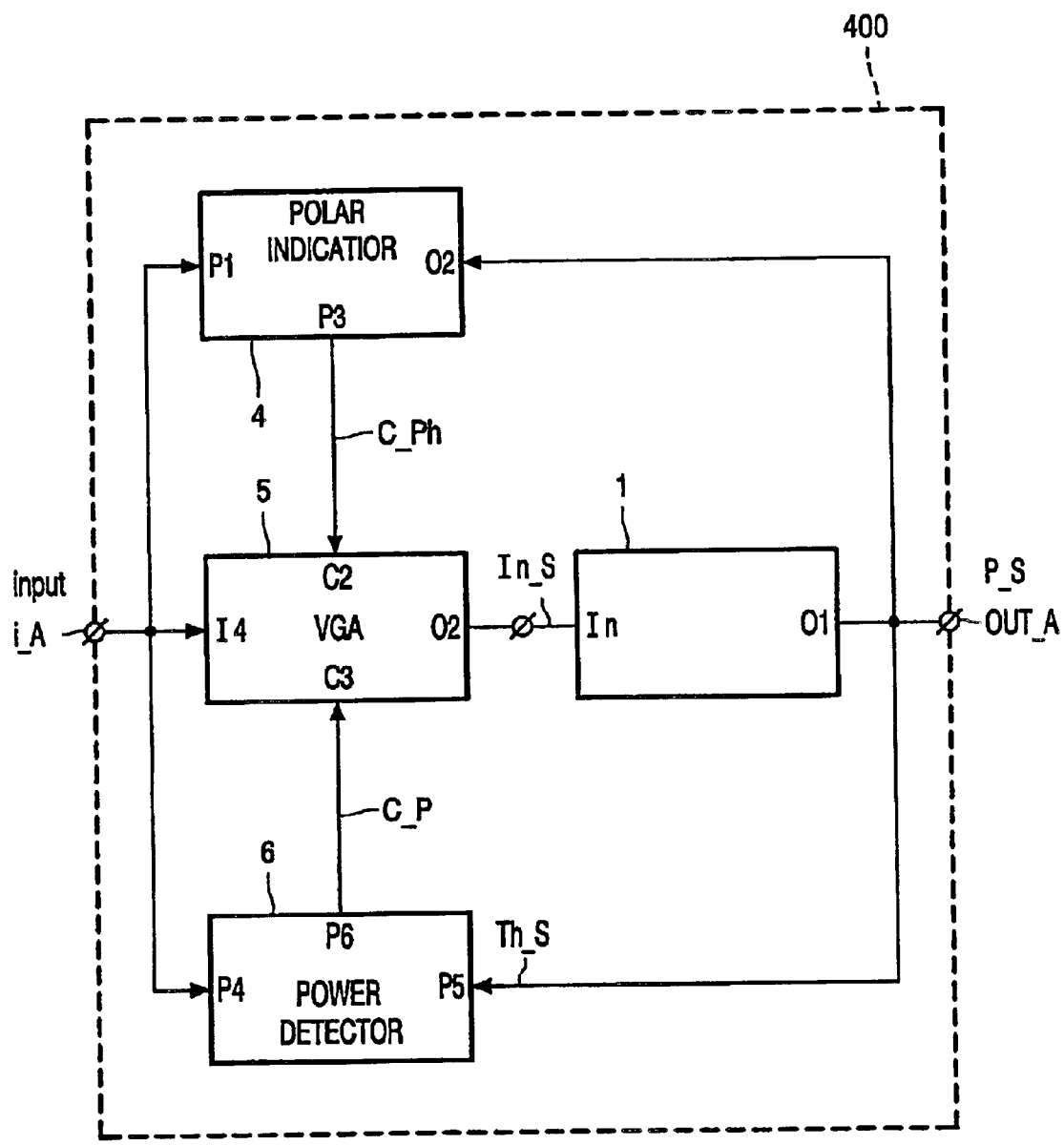

The above and other features and advantages of the invention will be apparent from the following description of exemplary embodiments of the invention with reference to the accompanying drawings, in which:

FIG. 1 depicts a block diagram of a communication system 1 in accordance to an embodiment of the present invention, FIG. 2 depicts in more detail the detector 20 and the Bias Generator 30, FIG. 3 represents a MOS-type transistor embodiment of the detector 20 and of the Bias Generator 30, FIG. 4 depicts a bipolar-type transistor embodiment of the detector 20 and of the Bias Generator 30, FIG. 5 depicts the dependency between the signal C_S and the input signal In_S with different initial bias voltages in one embodiment of the invention, FIG. 6 depicts the dependency between the signal C_S and the input signal In_S having the same threshold level but different slopes in one preferred embodiment of the invention, FIG. 7 depicts the arrangement 400 in a preferred embodiment of the invention.

FIG. 1 shows a block diagram of a communication system 1 in accordance to the present invention. The communication system 1 comprises a power amplifier 10 having a first input I1, a first output O1 and a first control input C1. The communication system further comprises a detector 20 coupled to a Bias Generator 30. The detector has a second input I2 and a second output O2. The second input I2 is coupled to the first input I1 for receiving an input signal In_S. The detector is conceived to provide at the second output O2 a signal Th_S which is indicative for a power of the input signal In_S, the signal Th_S having a controllable bias level. The Bias Generator (BG) 30 comprises a third input I3 and a third output O3, the third input is coupled to the second output O2 for receiving the signal Th_S. The third output O3 is coupled to the first control input C1 being conceived to transmit a signal C_S for controlling the bias of the power amplifier 10 the bias being controlled such that when the power of the input signal In_S is relatively high the power amplifier 10 is biased with a relatively high voltage such that it's linearity and the efficiency are at a relatively optimum level. When the power of the input signal In_S is relatively low the control signal C_S is also relatively low and the power amplifier 10 is not biased, it's power consumption being at the lowest level possible.

FIG. 2 depicts a more detailed description of the detector 20 and of the Bias Generator 30. The detector 20 comprises a controlled amplifier means 201 coupled to the second input I2 and the second output O2. The detector 20 further comprises a control generator 202 coupled to the control amplifier means 201. The control generator generates a signal CG_S that controls the bias level of the signal Th_S transmitted at the second output O2.

The bias generator 30 comprises a Level Sensitive Current Generator (LSCG) 301 coupled to the third input I3 for receiving the signal Th_S and generating a current signal Cc. The LSCG 301 is characterized in that it's output current Cc is substantially linear with respect to the signal Th_S starting from a threshold level. When the amplitude of the input signal Th_S is below the threshold level the output current is substantially zero. The Bias Generator 30 further comprises an adapter 302 coupled to the LSCG 301 for receiving the signal Cc. The LSCG 301 is further coupled to the third output O3 for generating the control signal C_S. The adapter 302 comprises means for generating a suitable bias signal for the power amplifier 10. For example if the bias signal is a voltage the adapter comprises a controllable current to voltage converter for generating a suitable bias voltage for the power amplifier such that when the signal Th_S is lower than the threshold level of the LSCG 301 the said bias voltage is substantially zero and the power consumed by the power amplifier 10 attains it's minimum value. Otherwise, when the signal Th_S is larger than the threshold level of the LSCG 301 the output voltage generated by the adapter 302 is substantially linear with respect to the signal Th_S and being adapted to control the linearity and the efficiency of the power amplifier 10 with respect to the power of the input signal In_S. In an analogous manner a control current can be generated with a suitable realized adapter 302 being a relatively easy task for a person skilled in the art.

FIG. 3 represents a MOS-type transistor embodiment of the detector 20 and of the Bias Generator 30. The input signal In_S and the detector 20 are considered to be differential but the case of single ended input signal In_S or/and single ended detector 20 can be easily derived by a skilled person in the art. The detector 20 comprises controlled amplifier means comprising a pair of transistors T1 and T2 having transistors T5 and T6 as load. The input signal In_S is amplified and converted into a differential current that is further transformed into a differential voltage by the transistors T5 and T6. The transistors T5, T6 are connected as diode i.e. they have their drain connected to their gates. It is observed that any current to voltage converter could be used instead of the transistors T5 and T6, included, for example a simple resistor. The differential pair of transistors T1, T2 is biased by the control generator 202 realized with the DC voltage generator Vgg. The voltage generated by the voltage generator Vgg serves as the control signal CG_S. The voltage CG_S is further applied through resistors R to the gates of the transistors T1 and T2 controlling the bias of the pair of transistors T1, T2. The differential output signal between the drains of the transistors T1 and T2 is first filtered by a low-pass filter realized with the resistors R1 and R2 and the capacitor C1. It should be mentioned here that depending on the frequency domain of the amplifier the low-pass filter could otherwise be realized with inductors and capacitors, with switched capacitors. Furthermore for relatively very high frequency ranges the output impedance of the transistors T1 and T2 and the input capacitance of the transistor T3 could be sufficient for filtering the high frequency signal obtained in the drains of the transistors T1 and T2. The LSCG 301 is realized with the transistor T3 that, as any CMOS transistor, has a threshold voltage level. If the input signal Th_S is below the said threshold level the output current through the transistor is substantially zero. Otherwise the current in the drain of the transistor T3 is indicative for the amplitude of the input signal Th_S. The current Cc in the drain of the transistor T3 is transformed into a voltage by the transistor T7, resistor R3 and capacitor C2 but any current to voltage converter could be used instead. The dependency between the control signal C_S obtained in the drain of the transistor T3 and the signal Th_S is a substantially linear one being characterized by an initial bias level i.e. the threshold level and by a slope. In FIG. 5 the dependency between the control signal C_S and the input signal Th_S with different initial bias voltages is presented. In FIG. 6 the dependency between the control signal C_S and the input signal In_S having the same threshold level but different slopes, is presented. These dependencies of C_S to Th_S could be written as in relations (1) and (2).

$$C\_S = \text{slope}*(Th\_S-\text{threshold})+\text{initial bias; if } Th\_S \text{ is above the threshold} \quad (1)$$

$$C\_S = \text{initial bias; if } Th\_S \text{ is below the threshold} \quad (2)$$

As long as the Th_S signal is smaller than the threshold C_S signal is the initial bias as shows relation (2) otherwise the relation (1) is valid. The initial bias is determined by an initial DC current flowing through the transistor T3. Said DC current is further determined by the Th_S signal. The magnitude of the initial bias is further determined by the adapter 302 and applied to the power amplifier 10. It should be pointed out here that some of the parameters involved in relation (1) are controllable as follows:

the slope is controlled by the area occupied by the transistors T7 and T8, the initial bias is controlled by the resistors R3 and R4, the threshold is controlled by the control generator 202.

In FIG. 4 a bipolar-type transistor embodiment of the detector 20 and of the Bias Generator 30 is presented. It should be observed that the transistors having the same index and an accent (') have the same function as their MOS counterparts. It is further observed that a mixed technology implementation of the detector 20 and of the Bias Generator 30 is also possible, e.g. the detector 20 could be realized in MOS technology and the Bias Generator 30 could be realized in bipolar technology and reciprocally.

As shown in FIG. 3 the control signal generated by the Bias Generator 30 may be an output vector C_S having a plurality of components, here 2 components, Q1 and Q2. This type of Bias Generator is of interest when power amplifiers with multiple stages are considered. Considering that the power amplifier is a two-staged one then the component Q1 controls the bias of the first stage and the component Q2 controls the second stage. It is also possible to use a Bias Generator 30 like in FIG. 4 that generates a vector C_S having one component. In this situation an amplifier including multiple controlled stages could be realized by a cascade of communication systems (1). Therein each communication system has a power amplifier controlled by a respective combination of the detector (20) and the Bias Generator (30).

In some particular situation a further improvement of the linearity and/or efficiency of the power amplifier 10 may be necessary. When these requirements are formulated an arrangement as that presented in FIG. 7 could be used. In FIG. 7 the communication system 1 is coupled to a Variable Gain Amplifier (VGA) 5. The said arrangement further comprises an input I_A for receiving an input signal Input having a first phase and a first amplitude and an output Out_A for transmitting an output signal P_S having a second phase and a second amplitude. The arrangement 400 further comprises a polar indicator 4 having a first input P1 coupled to the input I_A and a second input P2 coupled to a the output Out_A. The polar indicator 4 generates a second control signal C_Ph to be transmitted through a first output P3. The second control signal C_Ph is indicative for a phase difference between the first phase and the second phase. The variable gain amplifier VGA 5 has an input 14 for receiving the input signal I_A, an output O2, a first control input C2, the output O2 being coupled to the input of the communication system 1, said VGA 5 being conceived to transmit a signal through the output O2 representing an amplification of the input signal I_A under the control of the second control signal C_Ph. Under these circumstances the arrangement 400 has an improved linearity when polar indicator 4 is used.

When an improvement of the efficiency is desired the arrangement 400 comprises the communication system 1 coupled to the Variable Gain Amplifier (VGA) 5. Let us consider that the input signal Input is characterized by a first power and the output signal P_S is characterized by a second power. The arrangement 400 further comprises a power indicator 6. The said power indicator comprises a third input P4 for receiving the input signal I_A, a fourth input P5 for receiving the output signal O_S. The power indicator 6 generates a third control signal C_P through a second output P6. The third signal C_P is proportional to a difference between the first power and the second power. The VGA 5 has a third control input C3 and is conceived to transmit a signal through the output O2 representing an amplification of the input signal I_A under the control of the third control signal C_P. The gain of the VGA 5 is controlled in such a manner that the difference between the first power and a part of the second power has a minimum level. Ideally, this difference is substantially zero and the arrangement is 100% efficient. Practically the difference depends on the power level of the signals and the power indicator 6 controls the VGA 5 in such a manner the efficiency is as close as possible 100%. As a matter of consequence the efficiency of the arrangement 400 comprising the power indicator 6 is improved. It is relatively easy for a person skilled in the art to couple the above-mentioned techniques in order to improve both the efficiency and the linearity of the arrangement as it is presented in FIG. 7.

It is remarked that the scope of protection of the invention is not restricted to the embodiments described herein. Neither is the scope of protection of the invention restricted by the reference numerals in the claims. The word 'comprising' does not exclude other parts than those mentioned in a claim.

The word 'a(n)' preceding an element does not exclude a plurality of those elements. Means forming part of the invention may both be implemented in the form of dedicated hardware or in the form of a programmed general-purpose processor. The invention resides in each new feature or combination of features.

What is claimed is:

1. A communication system (1) comprising a power amplifier (10) for amplifying an input signal (In_S) and emitting an amplified signal (O_S), the communication system (1) further comprising a detector (20) and a Bias Generator (BG) (30), the communication system (1) being characterized in that the detector (20) comprises a controlled amplifying means for generating an output signal (Th_S) said output signal being indicative for the power of the input signal (InS), the output signal (Th_S) having a controllable bias level, the BG (30) comprises a Level Sensitive Current Generator (LSCG) (301) for generating a current (Cc) controlled by the output signal (Th_S), the controllable threshold level of said signal being adaptable to the LSCG (301), said LSCG (301) having a threshold level (TL) such that when the signal (Th_S) is lower than the threshold level (TL) the current (Cc) is substantially zero, otherwise the current (Cc) being linearly controlled by the signal (Th_S), the BG (30) further comprises an adapter (302) coupled to the LSCG (301) comprising a current controlled adapting means for generating a control signal (C_S) for controlling a property of the amplifier, the control signal (C_S) having a controllable linear dependency on the current (Cc).

2. A communication system (1) as claimed in claim 1 wherein the controlled amplifier means (201) of the detector (20) further comprises an amplifier (T1, T2, T5, T6) coupled to a low-pass filter for amplifying the input signal (In_S) in a controllable manner and transmitting the output signal (Th_S).

3. A communication system (1) as claimed in claim 1 wherein the output signal (Th_S) is substantially a direct current (DC) signal.

4. A communication system (1) as claimed in claim 2 wherein the low-pass filter comprises a plurality of resistors and capacitors.

5. A communication system (1) as claimed in claim 1 wherein the control signal (C_S) is a vector of signals.

6. A communication system (1) as claimed in claim 5 wherein the power amplifier (10) comprises a plurality of stages coupled in cascade, each stage being controlled by a component of the control signal (C_S).

7. An emitting system comprising a plurality of communication systems (1) as claimed in claim 1 coupled in series.

8. An arrangement (400) comprising a communication system (1) as claimed in claim 1 coupled to a Variable Gain Amplifier (VGA), the arrangement (400) further comprising an input (I_A) for receiving an input signal (Input) having a first phase and a first amplitude and an output (Out_A) for transmitting an output signal (P_S) having a second phase and a second amplitude, a polar indicator (4) having a first receiving input (P1) coupled to the input (I_A) and a second receiving input (P2) coupled to the output (Out_A) for generating a second control signal (C_Ph) to be transmitted through a first transmitting output (P3), the second control signal (C_Ph) being indicative for a phase difference between the first phase and the second phase, the variable gain amplifier (VGA) (5) having an input (I4) for receiving the input signal (Input), an output (O2), a first control input (C2) for receiving the second control signal (C_Ph), the output (O2) being coupled to the input of the communication system (1), said VGA (5) being conceived to transmit a signal through the output (O2) representing an amplification of the input signal (I_A) under the control of the second control signal (C_Ph).

9. An arrangement (400) comprising a communication system (1) as claimed in claim 1 coupled to a Variable Gain Amplifier (VGA), the arrangement (500) further comprising an input (I_A) for receiving an input signal (Input) having a first phase and a first power and an output (Out_A) for transmitting an output signal (P_S) having a second phase and a second power, a power indicator (6) comprising a third receiving input (P4) for receiving the input signal (I_A), a fourth receiving input (P5) for receiving the output signal (P_S) for generating a third control signal (C_P) through a second transmitting output (P6), the third control signal (C_P) being substantially proportional to a power difference between the first power and a part of the second power, a variable gain amplifier (VGA) (5) having an input (I4) for receiving the input signal (I_A), an output (O2) and a third control input (C3) for receiving the third control signal (C_P), the output (O2) being coupled to the input of the communication system (1), said VGA (5) being conceived to transmit a signal through the output (O2) representing an amplification of the input signal (I_A) under the control of the third control signal (C_P).

* * * * *